(12) United States Patent
Takeuchi et al.

(10) Patent No.: US 6,586,827 B2
(45) Date of Patent: Jul. 1, 2003

(54) WIRING BOARD AND METHOD FOR FABRICATING THE SAME

(75) Inventors: Hiroki Takeuchi, Komaki (JP);
Toshifumi Kojima, Komaki (JP);
Kazushige Obayashi, Nagoya (JP);
Hisahito Kashima, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 10/026,928

(22) Filed: Dec. 27, 2001

(65) Prior Publication Data

US 2002/0132094 A1 Sep. 19, 2002

(30) Foreign Application Priority Data

Dec. 27, 2000 (JP) .......................... 2000-398871
Aug. 27, 2001 (JP) .......................... 2001-255780
Nov. 19, 2001 (JP) .......................... 2001-352486

(51) Int. Cl.[7] .............................................. H01L 23/22
(52) U.S. Cl. .................... 257/687; 257/793; 257/795; 257/789; 361/762
(58) Field of Search ................ 257/788, 787, 257/789, 793, 795, 687, 701; 361/762

(56) References Cited

U.S. PATENT DOCUMENTS 3,849,187 A * 11/1974 Fetscher et al. ............ 117/201
4,282,136 A * 8/1981 Hunt et al. .................... 260/38
4,710,796 A * 12/1987 Ikeya et al. .................... 357/72
5,043,211 A * 8/1991 Yoshizumi et al. ............ 428/331
5,317,195 A * 5/1994 Ishikawa et al. ............ 257/787
5,656,862 A * 8/1997 Papathomas et al. ........ 257/778
6,194,491 B1 * 2/2001 Fujii et al. .................... 523/466
6,300,686 B1 * 10/2001 Hirano et al. ................ 257/783
6,324,067 B1 * 11/2001 Nishiyama .................... 361/761
6,396,143 B1 * 5/2002 Kimbara et al. ............. 257/712
6,410,615 B1 * 6/2002 Taniguchi et al. ........... 523/211

FOREIGN PATENT DOCUMENTS

| JP | 4-356998 | 12/1992 |
| JP | 6-326472 | 11/1994 |
| JP | 7-263619 | 10/1995 |
| JP | 11-45955 | 2/1999 |
| JP | 11-54939 | 2/1999 |
| JP | 11-67961 | 3/1999 |
| JP | 11-74648 | 3/1999 |
| JP | 11-126978 | 5/1999 |
| JP | 11-307687 | 11/1999 |
| JP | 2000-124352 | 4/2000 |

* cited by examiner

Primary Examiner—Cathy Lam
(74) Attorney, Agent, or Firm—Morgan, Lewis & Bockius LLP

(57) ABSTRACT

A wiring board includes a substrate having an opening, and an electronic part placed in the opening, wherein a space left in the opening is filled with an embedding resin having a base color tone selected from black, blue, green, red, orange, yellow, and violet.

18 Claims, 9 Drawing Sheets

WIRING BOARD AND METHOD FOR FABRICATING THE SAME

The present invention claims the benefit of Japanese Patent Application Nos. 2000-398871 filed on Dec. 27, 2000 in Japan, 2001-255780 filed on Aug. 27, 2001 in Japan, and 2001-352486 filed on Nov. 19, 2001 in Japan, which are all hereby incorporated by reference.

BACKGROUND OF THE INVENTION

1. Field of the Invention

The present invention relates to a wiring board and a method for fabricating a wiring board, and more particularly, to a multi-layer wiring board or a package for storing semiconductor elements and a method for fabricating a multi-layer wiring board or package.

2. Discussion of the Related Art

In recent years, various studies have been performed on multi chip modules (MCMs) in which a number of semiconductor elements are mounted on a build-up wiring board. Typically, by use of solder, electronic parts, such as chip capacitors, chip inductors, and chip resistors, for example, are mounted on the surface of a wiring layer formed on the surface of the wiring board.

Electronic parts that require predetermined regions for mounting are mounted on the surface of the build-up wiring board. Therefore, a limitation is imposed on miniaturization of the wiring board. Also, depending on the layout of wiring for surface mounting, parasitic inductance of the wiring, which is an undesirable property, becomes large. This factor hampers incorporation of such wiring boards into electronic devices of higher frequency.

In order to solve the aforementioned problems, various studies have been performed on methods for embedding electronic parts in an insulating substrate. Japanese Patent Application Laid-Open (kokai) No. 11-126978 discloses a method in which electronic parts are mounted by use of solder, in advance, on a wiring board having a transfer sheet formed from metallic foil, and then the parts are transferred. However, the method is problematic in terms of accuracy in positioning of the mounted parts.

Japanese Patent Application Laid-Open (kokai) No. 2000-124352 discloses a multi-layer wiring board in which an insulating layer is built up on electronic parts embedded on a core substrate. Where electronic parts are embedded in a substrate such as a core substrate, after a space between the substrate and the electronic parts is filled with an embedding resin, and an insulating layer and a wiring layer are built up on the substrate, the electrode of the electronic part must be electrically connected to the wiring formed on the insulating layer, through a metalization technique such as electroless plating.

The embedding resin is desirably colored black in order to prevent random reflection of light, which would otherwise raise problems when a wiring pattern is formed on the built-up insulating layer through exposure and development, or to reduce non-uniformity in color of the resin during curing of the resin. Therefore, carbon or a similar material must be incorporated, as a coloring agent, into the resin. However, when carbon, which is electrically conductive, is excessively incorporated into the embedding resin, the insulating property of the resin deteriorates. Therefore, it is important to design the method for coloring the resin black so that random reflection of light is prevented and non-uniformity in color of the resin is reduced during curing of the resin, with the insulating property between electronic parts or between wiring portions formed on the insulating layer being maintained.

A problem arises when a wiring board is used under high-frequency conditions in that there is loss of electrical signals in high-frequency regions. In order to reduce loss of electrical signals, an embedding resin used for embedding electronic parts in the wiring board must have low dielectric constant and exhibit low dielectric loss.

SUMMARY OF THE INVENTION

Accordingly, the present invention is directed to a wiring board and a method for fabricating a wiring board that substantially obviates one or more of the problems due to limitations and disadvantages of the related art.

An object of the present invention is to provide a wiring board having improved insulating properties, and for preventing random reflection of light, and reducing non-uniformity in color of the resin.

Another object of the present invention is to provide a method for fabricating a wiring board having improved insulating properties, and for preventing random reflection of light, and reducing non-uniformity in color of the resin.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the wiring board includes a substrate having an opening, and an electronic part placed in the opening, wherein a space left in the opening is filled with an embedding resin having a base color tone selected from black, blue, green, red, orange, yellow, and violet.

In another aspect, a method for fabricating a wiring board includes forming a first opening in a first substrate, placing a first electronic part in the first opening, and filling a space in the first opening with an embedding resin having a base color tone selected from at least one of black, blue, green, red, orange, yellow, and violet.

It is understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
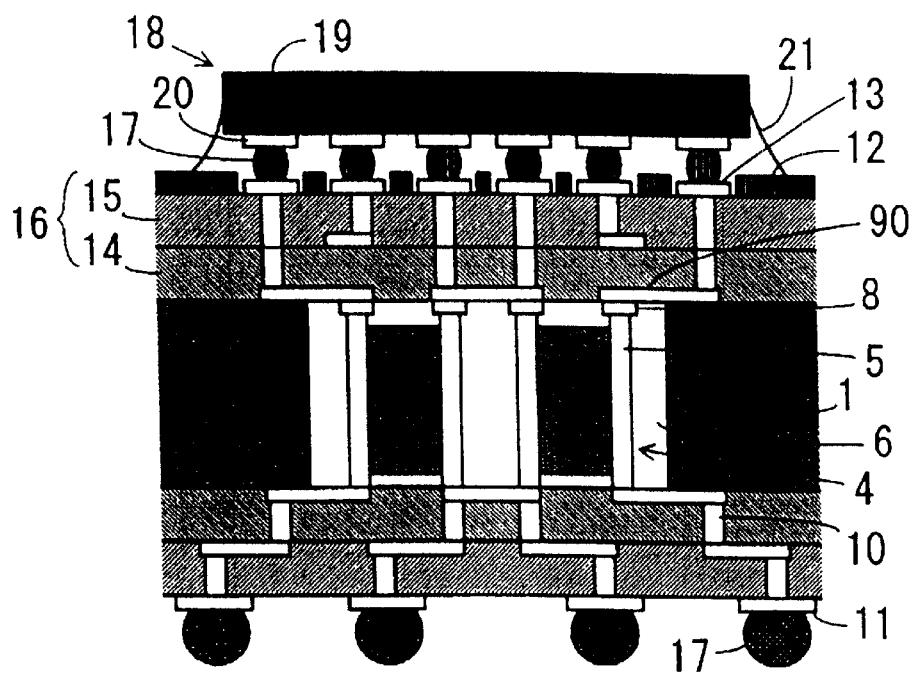
FIG. 1 is an explanatory view showing an exemplary BGA board formed using an embedding resin according to the present invention.

FIG. 1 is an explanatory view showing an exemplary BGA board formed using an embedding resin according to the present invention, and FIGS. 2–9 are cross sectional views illustrating a production process for forming an exemplary BGA wiring board according to the present invention.

Figure 2:
FIGS. 2–9 are cross sectional views illustrating an exemplary production process for forming an exemplary BGA wiring board according to the present invention.

In FIG. 2, a through hole 2 of predetermined size may be formed in a core substrate 1 by use of a die. For example, a backing tape 3 may be applied onto a first surface of the core substrate; and the core substrate is placed such that the backing tape is located below the core substrate.

Figure 3:
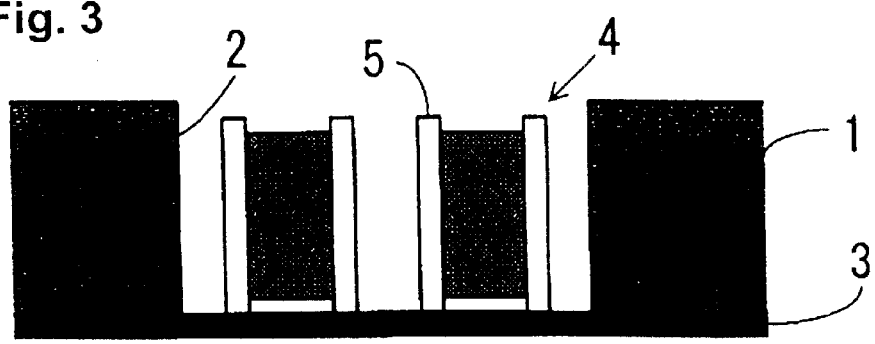

In FIG. 3, chip capacitors 4 may be mounted, at predetermined positions, on an adhesive surface of the backing tape 3 within the opening 2 by use of a chip mounter. In order to embed the chip capacitor 4 in an embedding resin effectively, the chip capacitor 4 includes electrodes 5 projecting from the capacitor main body.

Figure 4:
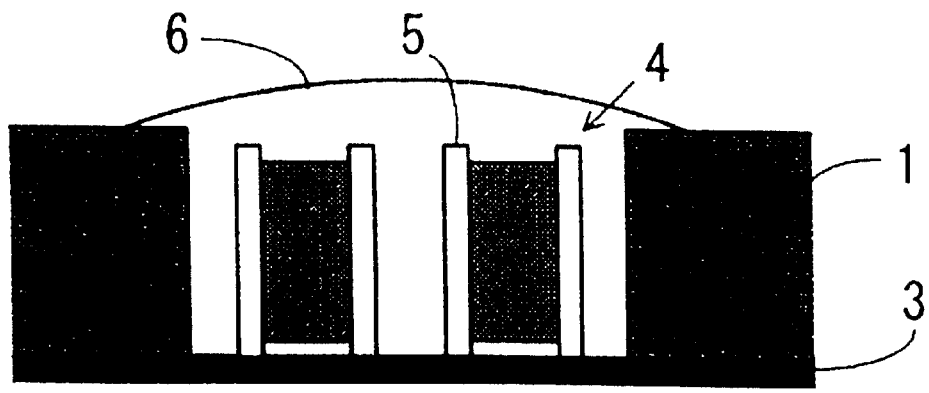

In FIG. 4, an embedding resin 6 may be fed into spaces between the opening 2 and the chip capacitors 4 that are provided in the opening 2. The embedding resin 6 may be subjected to defoaming and curing at about 100° C. for about 80 minutes, at about 120° C. for about 60 minutes, and at about 160° C. for about 10 minutes. The surface of the cured embedding resin 6 is subjected to rough polishing by use of a belt sander, and then finished through lap polishing.

Figure 5:
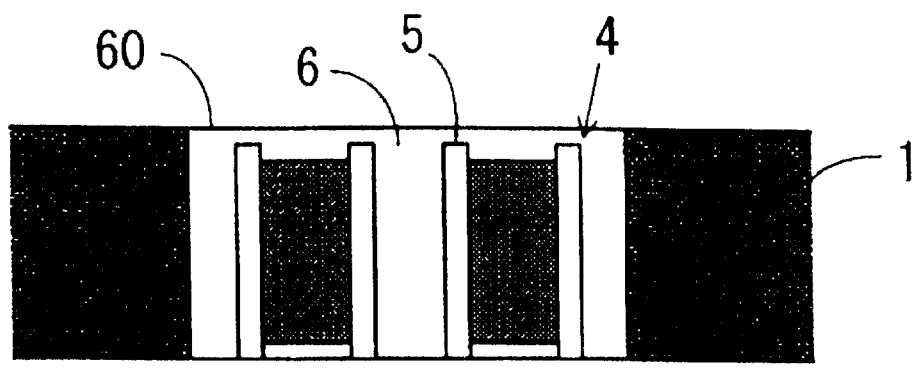

In FIG. 5, a surface 60 of the embedding resin 6 may be planarized after polishing.

Figure 6:
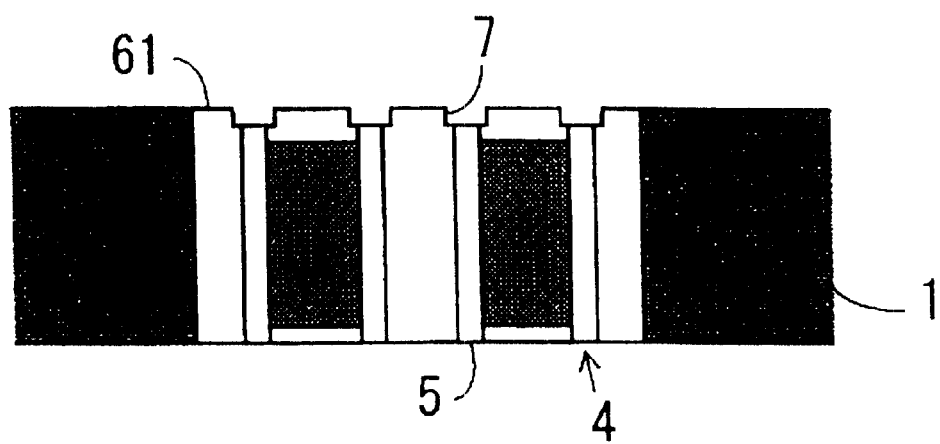

In FIG. 6, via holes 7 may be formed by means of a carbon dioxide gas laser, thereby exposing the electrodes 5 of the chip capacitors 4. Thereafter, an exposure surface 61 of the embedding resin 6 may be roughed by use of a swelling solution and a $KMnO_4$ solution.

Figure 7:
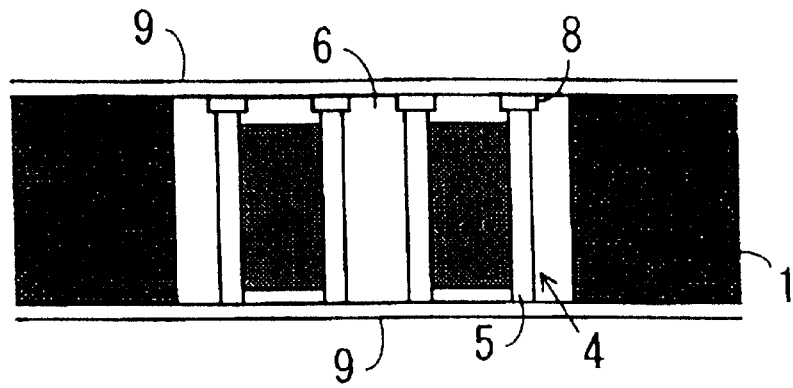

In FIG. 7, after the roughed surface is activated by use of a Pd catalyst, the surface may be subjected to electroless plating and then electroplating, thereby forming a copper plating layer 9.

Figure 8:
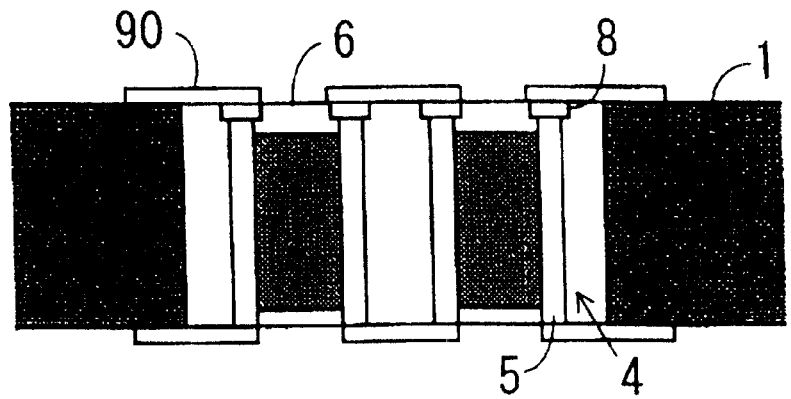

In FIG. 8, a resist (not illustrated) may be formed on the plating layer, and a predetermined wiring pattern may be formed through patterning. Unwanted copper may be removed through etching by use of $Na_2S_2O_8$/concentrated sulfuric acid, for example. Subsequently, the resist may be removed, thereby completing formation of a wiring 90.

Figure 9:
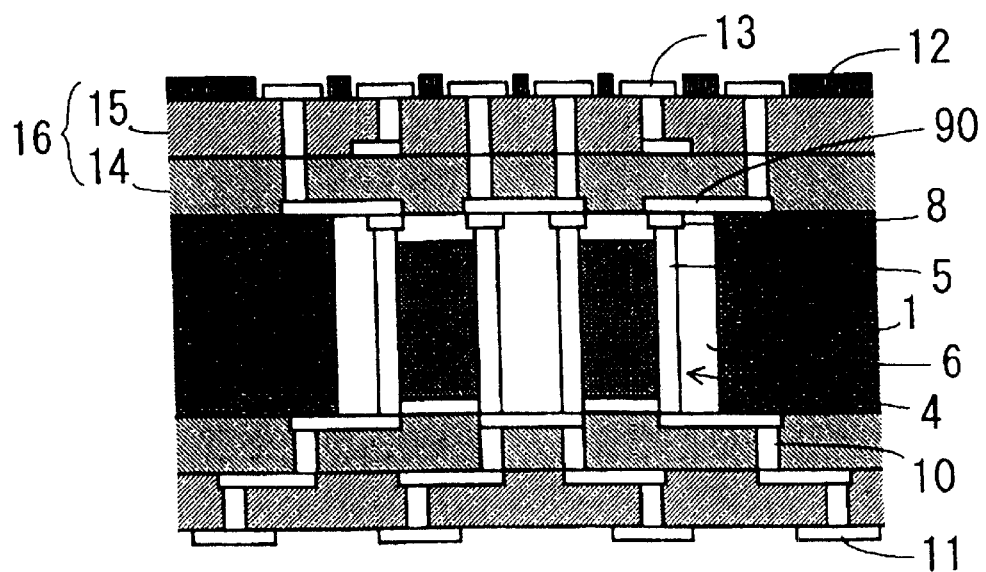

In FIG. 9, insulating films 14 and 15 may be laminated on the wiring 90, and then cured through heating. Thereafter, the insulating films 14 and 15 may be irradiated with a laser, thereby forming via holes for connecting the layers. A surface of an outer insulating layer may be roughened by use of an oxidizing agent, and a predetermined wiring pattern may be formed on the insulating films 14 and 15 in a manner similar to that described above. A dry film which is to serve as a solder resist layer may be laminated on the outermost surface of the wiring substrate, and a mounting pattern of a semiconductor element may be formed on the dry film through exposure and development, thereby forming a solder resist layer 12. Terminal electrodes 13 on which a semiconductor element is to be mounted may be subjected to Ni plating, and then Au plating.

Figure 10:
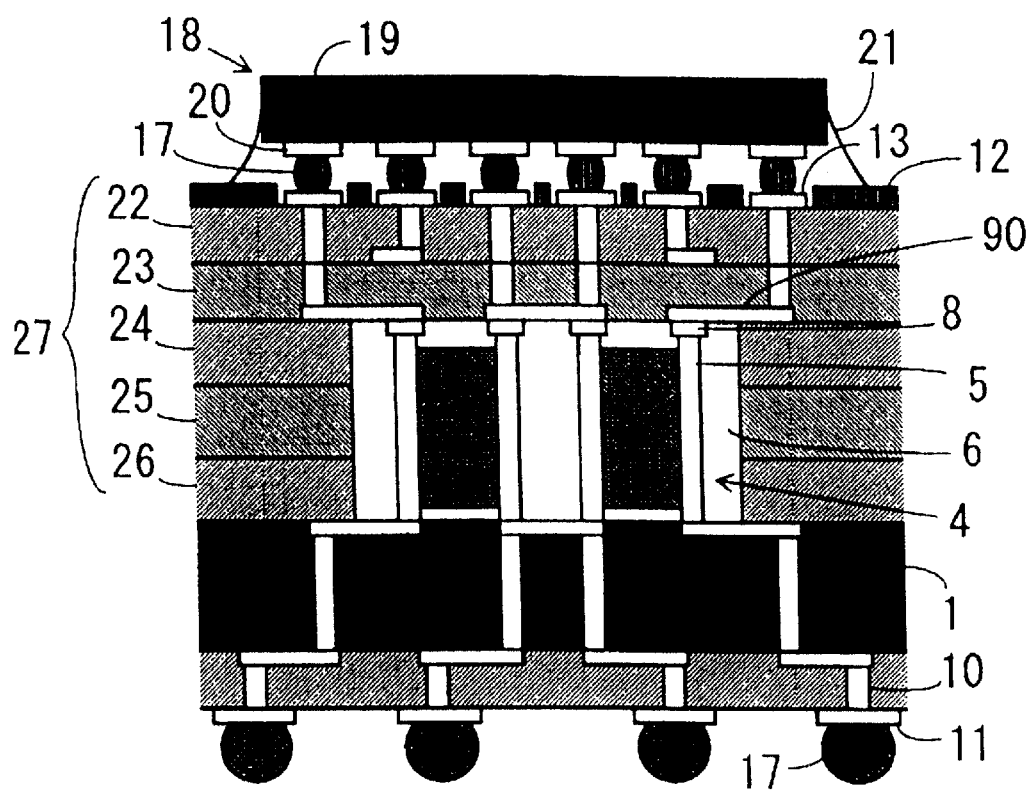
FIG. 10 is a cross sectional view illustrating another exemplary BGA board formed using an embedding resin according to the present invention.

In FIG. 10, a semiconductor element 18 may be mounted on the terminal electrodes 13 through use of a solder reflow furnace. Before the element is mounted, solder balls 17 may be formed on the terminal electrodes 13 by use of low-melting-point solder. Spaces between solder balls may be filled with an underfill material 21 by use of a dispenser, and the material is cured through heating, thereby producing the exemplary wiring substrate shown in FIG. 1.

Effects exerted by the wiring board of the present invention will next be described by way of Examples in which evaluation samples are employed. An embedding resin was prepared as follows: components were weighed so as to attain a formulation shown in Table 1 and mixed together, and the resultant mixture was kneaded by use of a three-roll mill. Items shown in Table 1 will next be described in detail. Different epoxy resins include: HP-4032D-naphthalene-type epoxy resin of high purity (product of Dainippon Ink and Chemicals, Inc.); YL-983U-bisphenol-F-type epoxy resin (product of Yuka Shell); E-850S-bisphenol-A-type epoxy resin (product of Dainippon Ink and Chemicals, Inc.); and N-740-phenol-novolak-type epoxy resin (product of Dainippon Ink and Chemicals, Inc.). Different curing agents include: QH-200-acid anhydride-based curing agent (product of Nippon Zeon Co., Ltd.); B-570-acid anhydride-based curing agent (product of DIC); B-650-acid anhydride-based curing agent (product of DIC); YH-306-acid anhydride-based curing agent (product of Yuka Shell Epoxy K.K.); and YH-300-acid anhydride-based curing agent (product of Yuka Shell Epoxy K.K.). One curing accelerator includes 2MAOK-imidazole-based curing agent (product of Shikoku Corporation). One inorganic filler included FB-5LDX-silane-coupled filler (product of Denki Kagaku Kogyo K.K., maximum particle size as measured by means of particle size distribution: 24 µm). Different coloring agents include: Black 1-carbon black #4300 (product of Tokai Carbon Co., Ltd.); Black 2-Chromofine Black A1103 (product of Dainichiseika Color & Chemicals Mfg. Co., Ltd.); Blue-Cyanine Blue 5188 (product of Dainichiseika Color & Chemicals Mfg. Co., Ltd.); Green-Cyanine Green 5310R product of Dainichiseika Color & Chemicals Mfg. Co., Ltd.); Red-Chromofine Red 6811 (product of Dainichiseika Color & Chemicals Mfg. Co., Ltd.); Orange-2900 Pelican Fast Orange GR (product of Dainichiseika Color & Chemicals Mfg. Co., Ltd.); and Yellow-Chromofine Yellow 2080K (product of Dainichiseika Color & Chemicals Mfg. Co., Ltd.).

An organic coloring agent was incorporated in an amount of about 0.5 mass % into a mixture of epoxy resin, curing agent, and inorganic filler (amount of the mixture: 100 mass %). Carbon black was incorporated, in an amount shown in Table 1, into a mixture of epoxy resin, curing agent, and inorganic filler (amount of the mixture: 100 mass %). "Filler content" is about 65 mass %, with the total of the amounts of epoxy resin, curing agent, and filler being taken as 100 mass %. The accelerator content is about 0.1 mass %, with the total of the amounts of epoxy resin, curing agent, and filler being taken as 100 mass %. The ratio, on a functional group basis, of the epoxy resin to the curing agent is about 100/95. The balance represents the total of the amounts of the epoxy resin and the curing agent. Each of the embedding resin compositions shown in Table 1 was evaluated as follows.

A sample for evaluation of volume resistance was prepared as follows. Firstly, through screen printing an embedding resin was printed on a copper plate for Hull cell test so as to attain a width of about 60 mm, a length of about 90 mm, and a thickness of about 100 μm. Subsequently, the resin was defoamed and cured by the following three heating steps: heating at about 100° C. for about 80 minutes, at about 120° C. for about 60 minutes, and at about 160° C. for about 10 minutes. The resultant sample was subjected to measurement of volume resistance by use of a high resistance meter (model: HP4339B, product of HEWLETT PACKARD). For measurement of volume resistance, a resistivity cell having a diameter of 26 mm was employed, charging time was set to 20 seconds, and output voltage was set to 100 V.

A sample for evaluation of yield during exposure and development and for evaluation of volume resistance was prepared as follows. Firstly, the surface of the above-prepared plate sample was roughed by use of a swelling solution and a $KMnO_4$ solution. The roughed surface was activated by use of a Pd catalyst, and then subjected to electroless plating and electroplating, to thereby form a copper plating layer. A resist was formed on the plating layer, and subjected to exposure and development, to thereby form a comb-shaped wiring pattern having a line width of about 40 μm and a line space of about 20 μm. Unwanted copper was removed through etching by use of $Na_2S_2O_8$/concentrated sulfuric acid. Thereafter, the resist was exfoliated to thereby complete formation of the wiring. The percentage of the samples which have been passed is referred to as "exposure yield."

Criteria for determining whether or not the samples have been passed in the aforementioned evaluations are described below. The evaluation results are shown in Table 2, with a Volume resistance of about $1.0 \times 10^{14}$ Ω·cm or more, and an Exposure yield of about 95% or more.

TABLE 2

| Sample No. | Volume resistance ($\times 10^{14}$ Ω · cm) | Exposure yield (%) | Evaluation |
| --- | --- | --- | --- |
| 1 | 20.6 | 94 | CC |
| 2 | 48.0 | 98 | AA |
| 3 | 35.7 | 98 | AA |
| 4 | 26.7 | 97 | AA |
| 5 | 22.7 | 97 | AA |
| 6 | 17.0 | 95 | BB |
| 7 | 9.8 | 96 | BB |
| 8 | $9 \times 10^{-5}$ | 95 | DD |
| 9 | 46.3 | 98 | AA |
| 10 | 42.7 | 98 | AA |
| 11 | 36.5 | 98 | AA |
| 12 | 44.5 | 97 | AA |
| 13 | 38.8 | 96 | AA |
| 14 | 32.7 | 97 | AA |
| 15 | 18.8 | 98 | BB |

The results show that sample Nos. 1 through 5 and 9 through 14 (Examples) are excellent in terms of all the evaluation items. Sample Nos. 6 and 7 in which the carbon black content exceeds about 1.4 mass % (i.e., about 1.5 to about 2.0 mass %) and sample No. 15 containing the organic pigment in an amount of about 30 mass % are passed in the aforementioned evaluations, although they show somewhat low volume resistance. When the organic pigment is incorporated into sample No. 15 in an amount of more than about 30 mass %, filling ability thereof is lowered. Therefore, the upper limit of the organic pigment content is substantially 30 mass %. In contrast, in sample No. 8 (Comparative Example) in which the carbon black content is about 2.5 mass %, volume resistance is lowered to a level such that the insulating property cannot be maintained.

The embedding resin is preferably caused to assume any base color selected from among black, blue, green, red,

TABLE 1

| Sample No. | Epoxy resin | Curing agent | Accelerator | Filler content (%) | Coloring agent content (%) |
| --- | --- | --- | --- | --- | --- |
| 1 | HP-4032D | B-570 | 2MAOK | FB-5LDX 65 | — 0 |
| 2 | HP-4032D | QH-200 | 2MAOK | FB-5LDX 65 | #4300 0.1 |
| 3 | HP-4032D | B-570 | 2MAOK | FB-5LDX 65 | #4300 0.3 |
| 4 | HP-4032D | B-570 | 2MAOK | FB-5LDX 65 | #4300 0.5 |
| 5 | E-850S | YH-300 | 2MAOK | FB-5LDX 65 | #4300 1.0 |
| 6 | HP-4032D | B-650 | 2MAOK | FB-5LDX 65 | #4300 1.5 |
| 7 | E-152 | YH-300 | 2MAOK | FB-5LDX 65 | #4300 2.0 |
| 8 | N-740 | B-650 | 2MAOK | FB-5LDX 65 | #4300 2.5 |
| 9 | HP-4032D | B-570 | 2MAOK | FB-5LDX 65 | A1103 (black 2) 0.5 |
| 10 | HP-4032D | B-570 | 2MAOK | FB-5LDX 65 | 5188 (blue) 0.5 |
| 11 | HP-4032D | B-570 | 2MAOK | FB-5LDX 65 | 5310R (green) 0.5 |
| 12 | HP-4032D | B-570 | 2MAOK | FB-5LDX 65 | 6811 (red) 0.5 |
| 13 | HP-4032D | B-570 | 2MAOK | FB-5LDX 65 | GR (orange) 0.5 |
| 14 | HP-4032D | B-570 | 2MAOK | FB-5LDX 65 | 2080K (yellow) 0.5 |
| 15 | HP-4032D | B-570 | 2MAOK | FB-5LDX 45 | 5310R (green) 30 | orange, yellow, and violet. When prevention of lowering of resolution due to random reflection of light is an issue of particular importance, the base color of the resin is preferably black, blue, or green, with black being particularly preferred.

When the embedding resin is colored black, the following substances can be incorporated into the embedding resin: black carbonaceous powder such as carbon black, graphite, or a mixture of carbon black and graphite; powder of a black inorganic oxide such as $Cu_2O$, $CuO$, or $MnO_2$; and a black organic pigment.

Examples of the substance for imparting a blue color to the embedding resin include phthalocyanine-based pigments such as Phthalocyanine Blue and Cyanine Blue 5188; azo pigments such as Variamine Blue; organic pigments including anthraquinone-based pigments such as Anthraquinone Blue; and inorganic oxides such as ultramarine and cobalt blue.

Examples of the substance for imparting a green color to the embedding resin include phthalocyanine-based pigments such as Phthalocyanine Green and Cyanine Green 531 OR; azo pigments such as Chrome Green; organic pigments including triphenylmethane-based pigments such as Malachite Green; and powder of inorganic oxides such as $Cr_2O_3$.

Examples of the substance for imparting a red color to the embedding resin include azo pigments such as Azo Eosine, Azo Naphthol Red, and Lithol Red; organic pigments such as quinacridone, dianthraquinonyl red, and Chromofine Red 6811; and powder of inorganic oxides such as red iron oxide and cadmium red.

Examples of the substance for imparting an orange color to the embedding resin include azo pigments such as Chrome Orange and 2900 Pelican Fast Orange GR; organic pigments such as benzimidazolone; and inorganic oxides such as molybdate orange.

Examples of the substance for imparting a yellow color to the embedding resin include azo pigments such as Chrome Yellow, Chromofine Yellow 2080K, and Hansa Yellow; quinoline-based pigments such as Quinoline Yellow; anthraquinone-based pigments such as Anthraquinone Yellow; organic pigments such as benzimidazolone and isoindolinone; and powder of inorganic oxides such as cadmium yellow, chrome yellow, and Titan Yellow.

Examples of the substance for imparting a violet color to the embedding resin include anthraquinone-based pigments such as Anthraquinone Violet; organic pigments including triphenylmethane-based pigments such as Mitsui Crystal Violet; and powder of inorganic oxides such as manganese violet.

In order to cause the embedding resin to assume any base color selected from among black, blue, green, red, orange, yellow, and violet, a coloring agent may be used alone. Alternatively, coloring agents of various colors may be used in combination. In this case, pigments of red, yellow, and blue (i.e., the three primary colors) are preferably used in combination, since the embedding resin can be made to assume any desired color.

When a coloring agent, other than a conductive coloring agent such as carbon black, is incorporated into the embedding resin, the incorporation amount of the coloring agent is appropriately determined so as to attain a desired color suitable for the production process of a wiring board so that random reflection of light can be prevented or non-uniformity in color of the resin during curing thereof can be reduced. Typically, the incorporation amount of the coloring agent is 0.1–30 mass %.

Particularly preferably, the embedding resin used in the wiring board of the present invention is colored black by incorporating carbon black formed of fine particles into the resin. In order to maintain insulating properties of the embedding resin, carbon black may be incorporated into the resin in an amount of 1.4 mass % or less. When carbon black is incorporated into the embedding resin, insulating reliability and dielectric properties of the resin can be improved, and there can be prevented random reflection of light, which would otherwise raise problems when a wiring pattern is formed through exposure and development on an insulating layer built up on the embedding resin. Further, non-uniformity in color of the resin can be reduced during curing of the resin. Preferably, the amount of carbon black is 1.0 mass % or less. When the incorporation amount of carbon black exceeds 1.4 mass %, the volume resistance of the embedding resin is greatly lowered, resulting in deterioration of electrical properties.

In order to effectively solve problems in relation to formation of a wiring pattern through exposure and development, carbon black is incorporated into the embedding resin in an amount of 0.1–1.4 mass %. The amount of carbon black is preferably 0.1–1.0 mass %, more preferably 0.1–0.5 mass %, much more preferably 0.1–0.3 mass %.

When the incorporation amount of carbon black exceeds 1.5 mass %, the volume resistance of the resin, which is used as an index of insulating property of the resin, becomes less than $1.0 \times 10^{14}$ Ω·cm.

The embedding resin used in the wiring board of the present invention may contain a thermosetting resin as a resin component, and at least one inorganic filler. When the embedding resin contains at least a thermosetting resin, the embedding resin can be easily cured through heat treatment after charging of the resin. When an epoxy resin is used as the thermosetting resin, epoxy groups may be directly subjected to cationic polymerization by use of a photo-polymerization initiator such as a dialuriodonium salt.

In order to perform pre-curing prior to main curing, the thermosetting resin may contain a photosensitive resin. For example, the thermosetting resin may contain a photosensitive resin having an acryloyl group. When an epoxy resin is used as the thermosetting resin, epoxy groups may be directly subjected to photo-polymerization by use of a photo-polymerization initiator, to thereby pre-cure the resin.

The thermosetting resin is preferably an epoxy resin. Specifically, the thermosetting resin is preferably at least one species selected from among a bisphenol-type epoxy resin, a naphthalene-type epoxy resin, a phenol-novolak-type epoxy resin, and a cresol-novolak-type epoxy resin. This is because a cured epoxy resin has a three-dimensional network structure. Therefore, the cured embedding resin is not broken even after being subjected to roughing treatment, which is performed for improving the strength of adhesion between the resin and wiring by means of the anchor effect. Examples of the curing agent, which may be incorporated into the embedding resin, include acid-anhydride-based curing agents, imidazole-based curing agents, and phenol-based curing agents. Of these, acid-anhydride-based curing agents are particularly preferred. This is because incorporation of an acid-anhydride-based curing agent reduces the viscosity of the embedding resin, and enables efficient embedding operation at ambient temperature; i.e., at 23° C.±1° C.

When the fluidity of the embedding resin is poor, a space between electrodes of an electronic part tends to be insufficiently filled with the resin, permitting local differences in thermal expansion coefficient of the resin. Particularly, in consideration of heat resistance and moisture resistance of the embedding resin, a naphthalene-type epoxy resin exhibiting excellent heat resistance and moisture resistance is preferably used in the embedding resin.

Roughing of the embedding resin is typically performed by means of a wet method making use of an oxidizing agent such as potassium permanganate or chromic acid. However, roughing of the embedding resin may be performed by means of a dry method making use of plasma, laser power, etc.

Incorporation of an inorganic filler into the embedding resin is advantageous in that the thermal expansion coefficient of the cured embedding resin can be regulated and breakage of the roughed embedding resin is prevented by virtue of the effect of the inorganic filler serving as an aggregate.

No particular limitation is imposed on the inorganic filler, but crystalline silica, fused silica, alumina, silicon nitride, etc. are preferred. When the inorganic filler is incorporated into the embedding resin, the thermal expansion coefficient of the resin can be effectively reduced. Therefore, reliability of the resin with respect to thermal stress can be improved.

The particle size of the inorganic filler is preferably 50 μm or less, since a space between electrodes of an electronic part must be easily filled with the embedding resin. When the particle size exceeds 50 μm, a space between electrodes of an electronic part tends to be stuffed with the filler, and the space is insufficiently filled with the embedding resin. Thus, the thermal expansion coefficient of the resin tends to differ greatly from portion to portion. The lower limit of the particle size of the filler is preferably at least 0.1 μm. When the particle size is less than 0.1 μm, fluidity of the embedding resin may fail to be maintained. The particle size of the filler is preferably at least 0.3 μm, more preferably at least 0.5 μm. In order to lower the viscosity of the embedding resin and to fill the space with the resin sufficiently, distribution of the particle size is preferably widened.

In consideration of high fluidity and filling ability of the embedding resin, preferably, the inorganic filler assumes substantially a spherical shape. Particularly, a silica-based inorganic filler is preferred, since a spherical silica-based inorganic filler is easily available.

If desired, the inorganic filler may be subjected to surface treatment by use of a coupling agent. This is because when the inorganic filler is subjected to surface treatment, wettability between the inorganic filler and a resin component is improved, and fluidity of the embedding resin can be improved. Examples of the coupling agent employed include a silane-based coupling agent, a titanate-based coupling agent, and an aluminate-based coupling agent.

Figure 11:
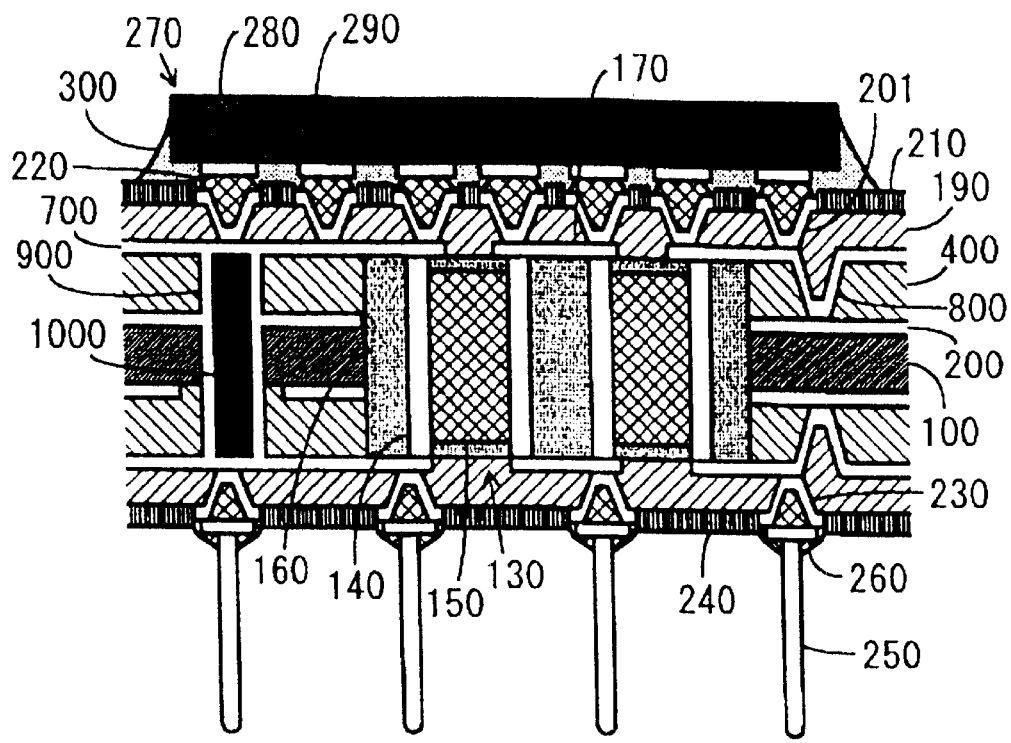
FIG. 11 is a cross sectional view illustrating an exemplary semiconductor device formed from an FC-PGA-type multi-layer printed wiring board according to the present invention.

The wiring board of the present invention in which electronic parts are embedded by use of an embedding resin exhibits exposure-development property and insulating reliability. The opening may be a through hole formed in a substrate through punching, or a cavity formed by means of multi-layer lamination. The substrate used in the present invention is preferably a core substrate, such as FR-4, FR-5, or BT. However, the substrate used in the present invention may be a substrate in which an opening is formed in a core substrate formed by sandwiching a copper foil having a thickness of about 35 μm between sheets of a thermoplastic resin such as PTFE. Alternatively, the substrate used in the present invention may be a substrate in which a build-up layer, which is formed by laminating an insulating layer and a wiring layer in alternating fashion, is formed on at least one surface of a core substrate, and an opening portion is formed so as to penetrate at least one of the core substrate and the build-up layer. When this substrate is employed for forming a multi-layer wiring board including capacitors as shown in FIG. 11, the thickness of the core substrate (insulating substrate) formed from, for example, a glass-epoxy composite material is advantageously reduced to about 400 μm (i.e., half the thickness of a typical core substrate (800 μm)). Therefore, the height of the wiring board can be reduced. In other example applications, this substrate can be employed for forming a wiring board including electronic parts embedded in a core substrate (see FIG. 1) or a wiring board including electronic parts embedded in a build-up layer (see FIG. 10). This substrate can be employed for forming a bump-grid-array-type package and a pin-grid-array-type package.

Examples of the aforementioned electronic part include passive electronic parts such as chip capacitors, chip inductors, chip resistors, and filters; active electronic parts such as transistors, semiconductor elements, FETs, and low-noise amplifiers (LNAs); and other electronic parts such as SAW filters, LC filters, antenna switch modules, couplers, and diplexers.

The following process may be used to produce a multi-layer wiring board including a substrate in which a build-up layer, which is formed by laminating an insulating layer and a wiring layer alternately, is formed on at least one surface of a core substrate, and an opening is formed so as to penetrate the core substrate and the build-up layer (see FIGS. 11 through 25).

FIG. 11 is a cross sectional view illustrating an exemplary semiconductor device formed from an FC-PGA-type multi-layer printed wiring board according to the present invention, and FIGS. 12–25 are cross sectional views illustrating an exemplary production process for forming an FC-PGA-type multi-layer printed wiring board according to the present invention.

Figure 12:
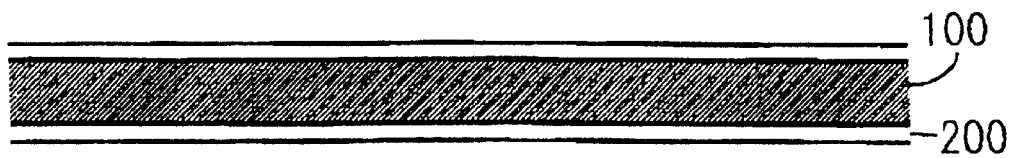
FIGS. 12–25 are cross sectional views illustrating an exemplary production process for forming an FC-PGA-type multi-layer printed wiring board according to the present invention.

In FIG. 12, a core substrate includes an FR-5-made insulating substrate 100 having a thickness of about 0.4 mm with a copper foil 200 having a thickness of about 18 μm applied on each respective surface of the insulating substrate 100. Properties of the core substrate are: glass transition temperature (Tg) as measured by means of TMA is about 175° C.; coefficient of thermal expansion (CTE) in a direction parallel to the substrate surface is about 16 ppm/° C.; coefficient of thermal expansion (CTE) in a direction perpendicular to the substrate surface is about 50 ppm/° C.; dielectric constant (ε) at 1 MHz is about 4.7; and tanδ at 1 MHz is about 0.018.

Figure 13:
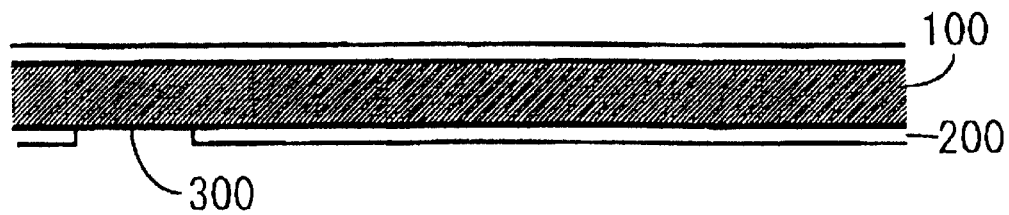

In FIG. 13, a photoresist film (not shown) may be applied onto the core substrate, and then subjected to exposure and development, thereby forming an opening (not shown) having a diameter of about 600 μm and another opening (not illustrated) corresponding to a predetermined wiring shape. The copper foil 200 exposed to the opening of the photoresist film may be removed through etching by use of an etching solution containing sodium sulfite and sulfuric acid. Subsequently, the photoresist film is exfoliated, thereby obtaining a core substrate having an exposure portion 300 and another exposure portion (not illustrated) corresponding to a predetermined wiring shape.

The core substrate may be subjected to etching by use of a commercially available etching apparatus (CZ treatment apparatus, product of Mec), to thereby rough the surface of the copper foil 200. Thereafter, an insulating film predominantly containing an epoxy resin having a thickness of about 35 μm may be applied onto both surfaces of the core substrate. Subsequently, the film may be cured at about 170° C. for about 1.5 hours, thereby forming an insulating layer 400. Properties of the cured insulating layer are as follows: glass transition temperature (Tg) as measured by means of TMA is about 155° C.; glass transition temperature (Tg) as measured by means of DMA is about 204° C.; coefficient of thermal expansion (CTE) is about 66 ppm/° C.; dielectric constant ($\epsilon$) at 1 MHz is about 3.7; tan$\delta$ at 1 MHz is about 0.033; percent weight loss at 300° C. is about 0.1%; percent water absorption is about 0.8%; moisture absorption percentage is about 1%; Young's modulus is about 3 GHz; tensile strength is about 63 MPa; and percent expansion is about 4.6%.

Figure 14:
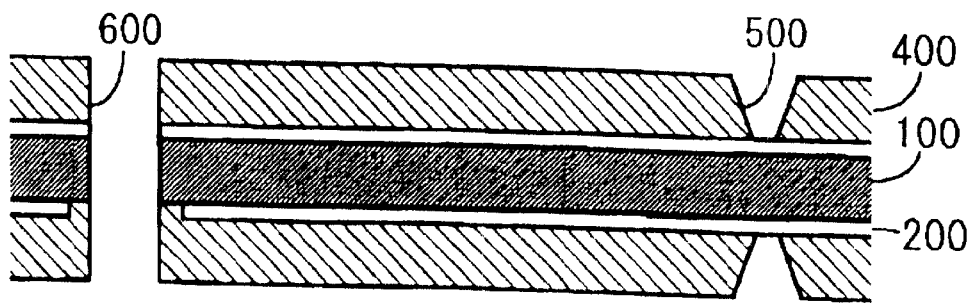

In FIG. 14, a via hole 500 for connecting layers may be formed in the insulating layer 400 by use of a carbon dioxide gas laser. The via hole 500 assumes a mortar-like shape, and has a top diameter of about 120 μm and a bottom diameter of about 60 μm. Furthermore, by use of a carbon dioxide gas laser of high power, a through hole 600 having a diameter of about 300 μm may be formed so as to penetrate the insulating layer 400 and the core substrate. The inner wall surface of the through hole 600 assumes a wavy form (not illustrated) attributed to laser processing. Subsequently, the substrate is soaked in a catalyst activation solution containing palladium chloride, and then the entire surface of the substrate is subjected to electroless copper plating (not illustrated).

Figure 15:
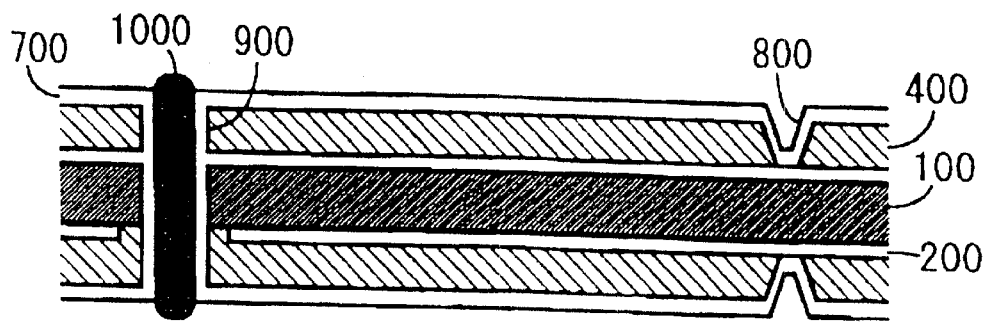

In FIG. 15, the entire surface of the substrate may be subjected to copper panel plating, thereby forming a copper layer 700 having a thickness of about 18 μm. Through copper plating, a via hole conductor 800 for electrically connecting layers may be formed in the via hole 500. In addition, a through hole conductor 900 for electrically connecting the top and bottom surfaces of the substrate may be formed in the through hole 600. The resultant substrate is subjected to etching by use of a commercially available etching apparatus (CZ treatment apparatus, product of Mec), thereby roughening the surface of the copper layer 700. Thereafter, the substrate may be subjected to rust preventive treatment (trademark: CZ treatment) making use of a rust preventive agent produced by Mec, thereby forming a hydrophobic surface. The contact angle (2θ) of the hydrophobic surface with respect to water as measured through a sessile drop method making use of a contact angle measurement apparatus (product name: CA-A, product of Kyowa Interface Science Co., Ltd.) is about 101°.

Unwoven paper is provided on a pedestal equipped with a vacuum suction apparatus, and the above-treated substrate is placed on the pedestal. A stainless steel mask having a through hole whose position corresponds to the position of the through hole 600 is provided on the substrate. Subsequently, a paste containing a copper filler is placed on the mask, and the through hole 600 is filled with the paste by use of a roller-type squeegee under pressurization.

In FIG. 15, a paste 1000 in the through hole 600 may be pre-cured at about 120° C. for about 20 minutes.

Figure 16:
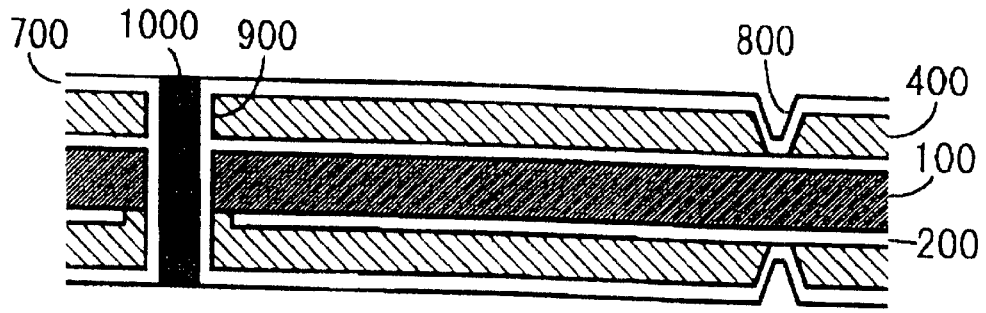

In FIG. 16, the surface of the substrate may be subjected to polishing (rough polishing) by use of a belt sander, and then subjected to buffing (finishing polishing), thereby planarizing the surface. Subsequently, the paste may be cured at about 150° C. for about five hours, thereby completing the step of embedding the through hole. A portion of the resultant substrate is employed for evaluation of the hole-embedding property.

Figure 17:
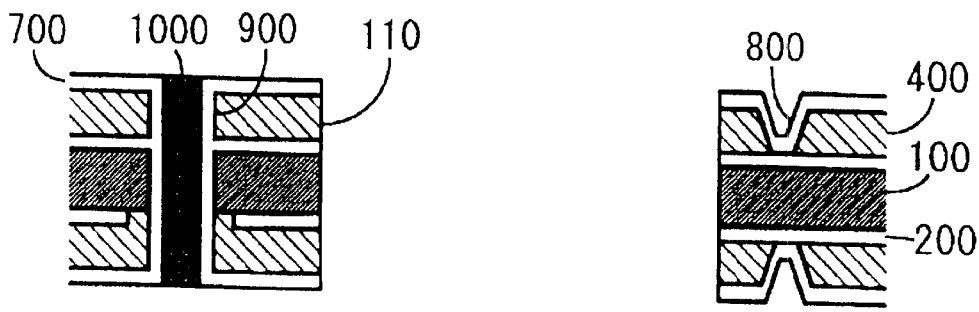

In FIG. 17, a square through hole 110 (size of about 8 mm×8 mm) may be formed by use of a die (not illustrated).

Figure 18:
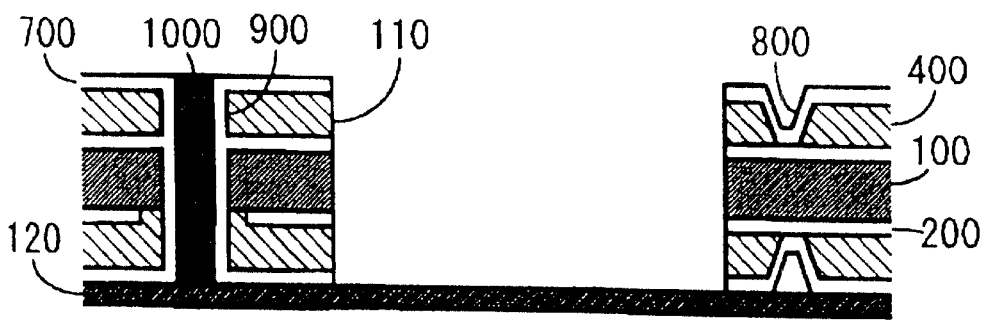

In FIG. 18, a masking tape 120 may be applied onto a bottom surface of the substrate.

Figure 19:
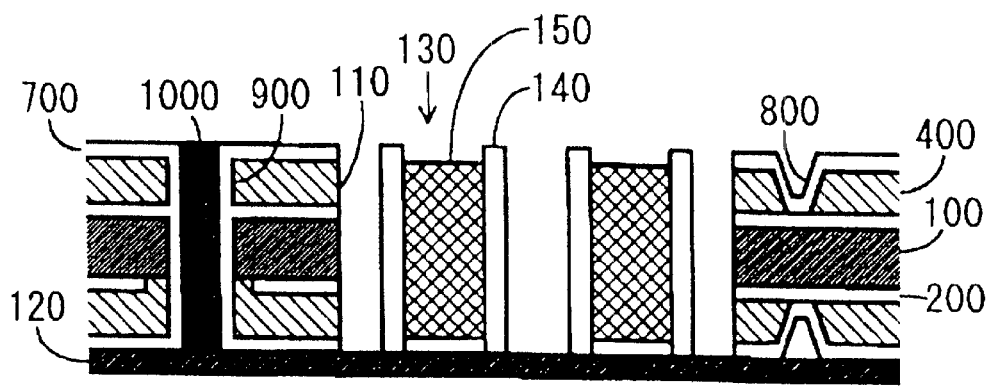

In FIG. 19, eight laminated chip capacitors 130 may be mounted on a portion of the masking tape 120 within the opening 110 by use of a chip mounter. Each of the laminated chip capacitors 130 includes a laminated body 150 having approximate dimensions of 1.2 mm×0.6 mm×0.4 mm and electrodes 140, each electrode having a height of about 70 μm greater than a height of the laminated body.

Figure 20:
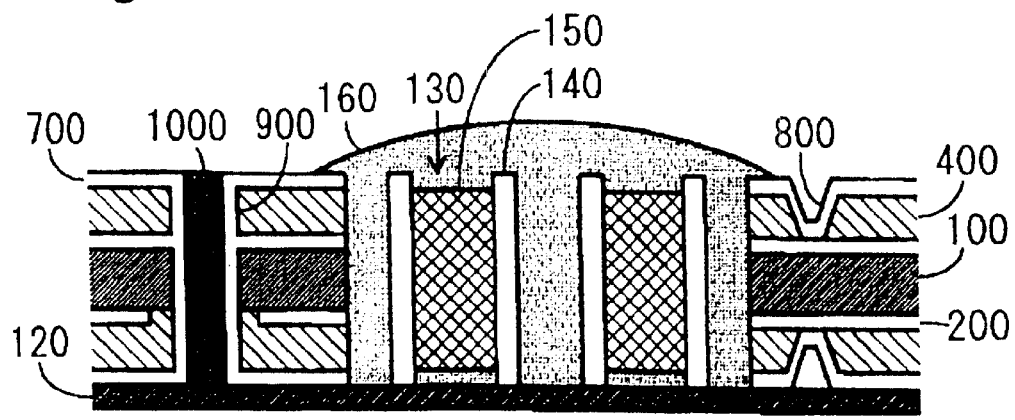

In FIG. 20, by use of a dispenser (not illustrated), the through hole 110 in which the laminated chip capacitors 130 are provided may be filled with an embedding resin 160 of the present invention. The embedding resin may be subjected to defoaming and pre-curing by the following steps: a primary heating step at about 80° C. for about three hours, and a secondary heating step at about 170° C. for about six hours.

Figure 21:
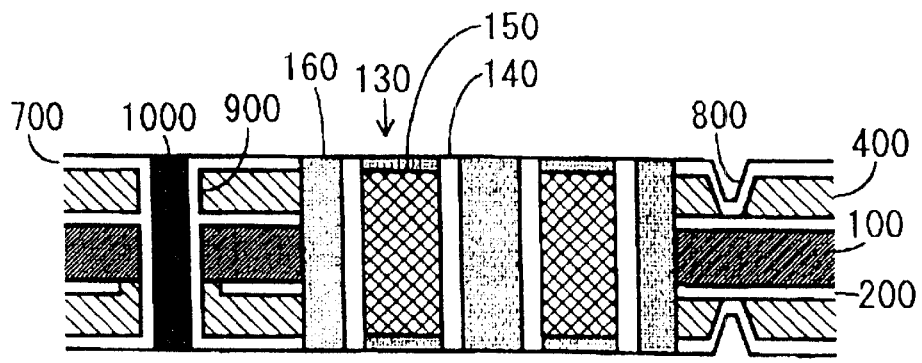

In FIG. 21, a surface of the pre-cured embedding resin 160 may be subjected to rough polishing by use of a belt sander, and then finished through lap polishing. The end surfaces of the electrodes 140 of the chip capacitors 130 may be exposed to the polished surface of the embedding resin. Subsequently, the pre-cured embedding resin 160 may be cured at about 150° C. for about five hours. Thereafter, the polished surface of the embedding resin 160 may be roughed by use of a swelling solution and a $KMnO_4$ solution.

Figure 22:
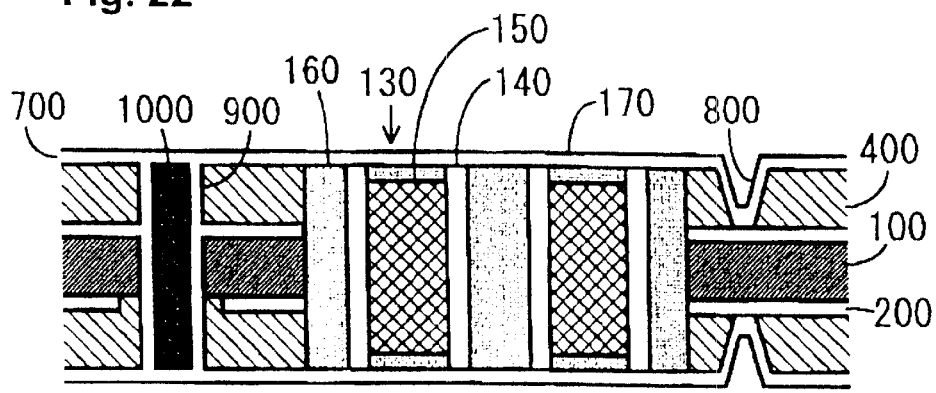

In FIG. 22, after the roughed surface is activated by use of a Pd catalyst, the surface may be subjected to electroless plating and then electroplating, thereby forming a copper plating layer 170. The plating layer 170 that is formed on the embedding resin 160 may be electrically connected to the end surfaces of the electrodes 140 of the chip capacitors 130. A resist (not illustrated) may be formed on the plating layer 170, and a predetermined wiring pattern may be formed through patterning. Unwanted copper is removed through etching by use of $Na_2S_2O_8$/concentrated sulfuric acid.

Figure 23:
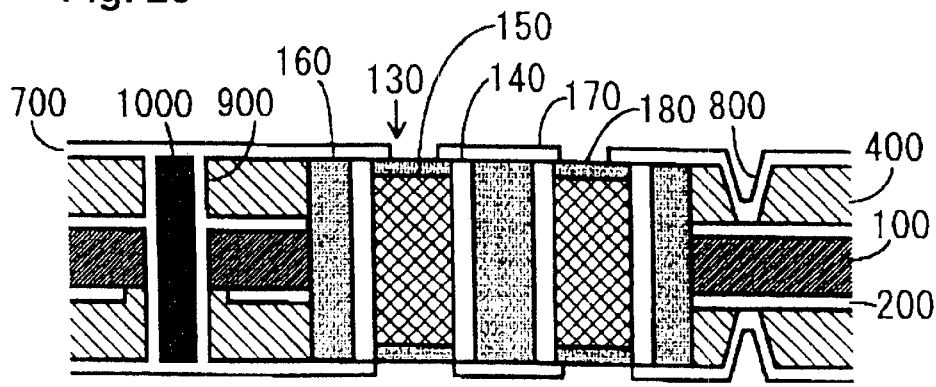

In FIG. 23, the resist is removed, thereby completing formation of a wiring board.

Figure 24:
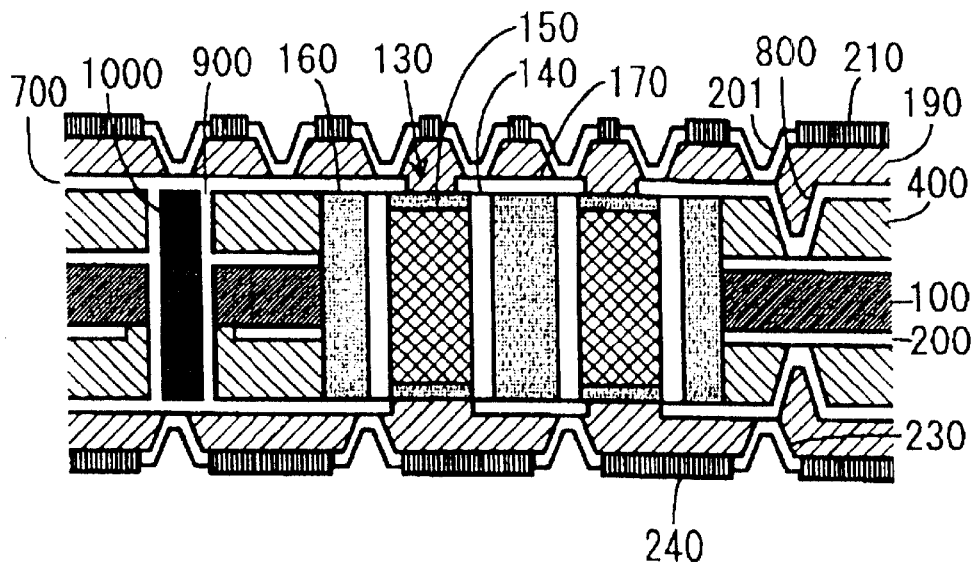

In FIG. 24, the surface of the resultant copper wiring may be roughened through etching by use of a commercially available etching apparatus (CZ treatment apparatus, product of Mec). On the copper wiring, a film 190 to serve as an insulating layer may be laminated, and then cured through heating. Thereafter, the film may be irradiated with a carbon dioxide gas laser, thereby forming via holes for connecting layers. The surface of the insulating layer 190 may be roughed by use of the aforementioned oxidizing agent, and predetermined wiring 201 may be formed on the insulating layer 190 in a manner similar to that described above. A dry film which is to serve as a solder resist layer may be laminated on the outermost surface of the wiring substrate, and a mounting pattern of a semiconductor element may be formed on the dry film through exposure and development, thereby forming a solder resist layer 210. On the bottom surface of the substrate to which pins for mounting are to be attached, predetermined wiring 230 and a solder resist layer 240 may be formed in a manner similar to that described above, thereby producing a multi-layer printed wiring board on which the pins are not attached. Terminal electrodes 201 on which a semiconductor element is to be mounted may be subjected to Ni plating and then Au plating (not shown). After a solder paste containing low-melting-point solder is printed on the plated electrodes, solder bumps 220 for mounting a semiconductor element may be formed through use of a solder reflow furnace.

Figure 25:
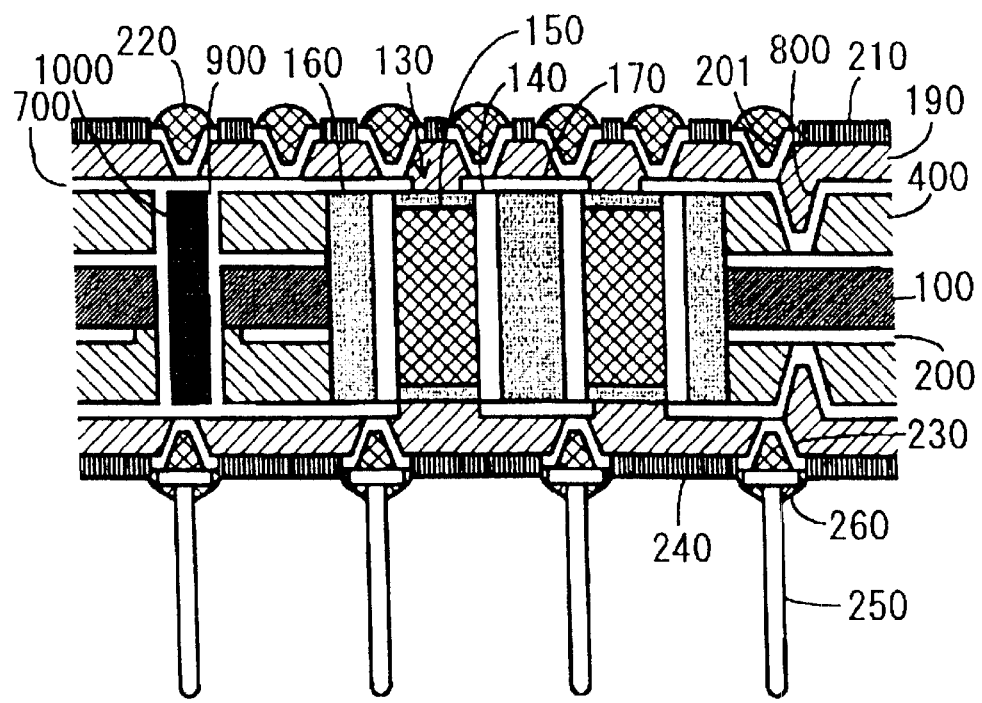

In FIG. 25, on the surface opposite to the surface on which a semiconductor element is to be mounted, a solder paste containing high-melting-point solder may be printed, and then solder bumps 260 for attaching pins are formed through use of a solder reflow furnace. While the wiring board is provided on pins 250 set on a jig (not shown), the wiring board may be placed in a solder reflow furnace (not shown), thereby attaching the pins 250 to the wiring board, thereby producing an FC-PGA-type multi-layer printed wiring board to which a semiconductor element is not attached. The distance between the position of the tip of each of the pins 250, which are attached on the region corresponding to the opening 110 which has been filled with the embedding resin 160 and the position of the tip as planned, is 0.1 mm or less, which is practically acceptable, as measured by use of a projector.

In FIG. 11, a semiconductor element 270 may be disposed on a position of the surface of the wiring board as follows. The semiconductor element 270 may be mounted on the wiring board, and then the wiring board is placed in a solder reflow furnace and heated at a temperature at which only the low-melting-point solder 220 is melted. The semiconductor element 270 is thereby securely mounted on the wiring board. Subsequently, the mounted portion is filled with an underfill material 300 by use of a dispenser, and then the material is cured through heating, thereby producing a semiconductor device including the FC-PGA-type multi-layer printed wiring board on which the semiconductor element 270 is mounted.

According to the wiring board of the present invention in which electronic parts are embedded by use of an embedding resin, random reflection of light during formation of a wiring pattern on the embedding resin through exposure can be prevented, thereby increasing production yield. Furthermore, when the amount of carbon black incorporated into the embedding resin is specified, excellent insulating property; i.e., a volume resistance of $1.0 \times 10^{14}$ Ω·cm can be attained.

It will be apparent to those skilled in the art that various modifications and variations can be made in the wiring board of the present invention without departing from the spirit or scope of the invention. Thus, it is intended that the present invention cover the modifications and variations of this invention provided they come within the scope of the appended claims and their equivalents.

What is claimed is:

1. A wiring board, comprising:
    a substrate having an opening; and
    an electronic part placed in the opening,
        wherein a space left in the opening is filled with an embedding resin having a base color tone including carbon black in an amount not to exceed 1.4 mass %.

2. The wiring board according to claim 1, wherein the embedding resin comprises a thermosetting resin as a resin component and at least one inorganic filler.

3. The wiring board according to claim 2, wherein the thermosetting resin is at least one selected from a bisphenol-type epoxy resin, a naphthalene-type epoxy resin, a phenol-novolak-type epoxy resin, and a cresol-novolak-type epoxy resin.

4. The wiring board according to claim 2, wherein the inorganic filler includes at least one of crystalline silica, fused silica, alumina, and silicon nitride.

5. The wiring board according to claim 4, wherein a particle size of the inorganic filler is within a range of 0.1–50 μm.

6. The wiring board according to claim 4, wherein the inorganic filler is substantially spherically-shaped.

7. The wiring board according to claim 1, wherein the electronic part includes at least one of chip capacitors, chip inductors, chip resistors, filters, transistors, semiconductor elements, field effect transistors, low-noise amplifiers, SAW filters, LC filters, antenna switch modules, couplers, and diplexers.

8. The wiring board according to claim 1, wherein the embedding resin comprises at least one coloring agent selected from carbon black, a phthalocyanine-based pigment, an azo pigment, a quinoline-based pigment, an anthraquinone-based pigment, a triphenylmethane-based pigment, and an inorganic oxide.

9. A wiring board, comprising:
    a substrate;
    a second substrate in which a build-up layer formed by laminating an insulating layer and a wiring layer in alternating fashion is formed on at least one surface of the substrate, and an opening is formed to penetrate either the substrate or the build-up layer,
    an electronic part placed in the opening,
        wherein a space left in the opening is filled with an embedding resin having a base color tone including carbon black in an amount not to exceed 1.4 mass %.

10. A wiring board, comprising:
    a substrate having an opening; and
    an electronic part placed in the opening,
        wherein a space left in the opening is filled with an embedding resin having a base color tone selected from blue, green, red, orange, yellow, and violet.

11. The wiring board according to claim 10, wherein the embedding resin comprises a thermosetting resin as a resin component and at least one inorganic filler.

12. The wiring board according to claim 11, wherein the thermosetting resin is at least one selected from a bisphenol-type epoxy resin, a naphthalene-type epoxy resin, a phenol-novolak-type epoxy resin, and a cresol-novolak-type epoxy resin.

13. The wiring board according to claim 11, wherein the inorganic filler includes at least one of crystalline silica, fused silica, alumina, and silicon nitride.

14. The wiring board according to claim 13, wherein a particle size of the inorganic filler is within a range of 0.1–50 m.

15. The wiring board according to claim 13, wherein the inorganic filler is substantially spherically-shaped.

16. The wiring board according to claim 10, wherein the electronic part includes at least one of chip capacitors, chip inductors, chip resistors, filters, transistors, semiconductor elements, field effect transistors, low-noise amplifiers, SAW filters, LC filters, antenna switch modules, couplers, and diplexers.

17. The wiring board according to claim 10, wherein the embedding resin comprises at least one coloring agent selected from carbon black, a phthalocyanine-based pigment, an azo pigment, a quinoline-based pigment, an anthraquinone-based pigment, a triphenylmethane-based pigment, and an inorganic oxide.

18. A wiring board, comprising:

a substrate;

a second substrate in which a build-up layer formed by laminating an insulating layer and a wiring layer in alternating fashion is formed on at least one surface of the substrate, and an opening is formed to penetrate either the substrate or the build-up layer; and an electronic part placed in the opening, wherein a space left in the opening is filled with an embedding resin having a base color tone selected from blue, green, red, orange, yellow, and violet.

\* \* \* \* \*